US00RE39690E

(19) United States
(12) Reissued Patent
Kalnitsky et al.

(10) Patent Number: US RE39,690 E
(45) Date of Reissued Patent: Jun. 12, 2007

(54) ENHANCED PLANARIZATION TECHNIQUE FOR AN INTEGRATED CIRCUIT

(75) Inventors: Alex Kalnitsky, San Francisco, CA (US); Yih-Shung Lin, Singapore (SG)

(73) Assignee: STMicroelectronics, Inc., Carrollton, TX (US)

(21) Appl. No.: 09/998,595

(22) Filed: Nov. 16, 2001

(Under 37 CFR 1.47)

Related U.S. Patent Documents

Reissue of:
(64) Patent No.: 5,986,330
Issued: Nov. 16, 1999
Appl. No.: 09/007,668
Filed: Jan. 15, 1998

U.S. Applications:
(63) Continuation of application No. 08/456,343, filed on Jun. 1, 1995, now abandoned, which is a continuation of application No. 08/163,043, filed on Dec. 6, 1993, now Pat. No. 5,435, 888.

(51) Int. Cl.
*H01L 23/58* (2006.01)

(52) U.S. Cl. ..... 257/644; 257/647; 257/634
(58) Field of Classification Search ..... 257/644, 257/647, 634
See application file for complete search history.

(56) References Cited

U.S. PATENT DOCUMENTS

| | | | | | |
|---|---|---|---|---|---|
| 4,253,907 | A | * | 3/1981 | Parry et al. | 438/715 |
| 4,354,896 | A | * | 10/1982 | Hunter et al. | 438/696 |
| 4,384,938 | A | * | 5/1983 | Desilets et al. | 204/298.33 |
| 4,654,112 | A | * | 3/1987 | Douglas et al. | 438/723 |
| 4,657,628 | A | * | 4/1987 | Holloway et al. | 438/647 |
| 4,660,278 | A | * | 4/1987 | Teng | 438/429 |

(Continued)

FOREIGN PATENT DOCUMENTS

| | | | | |
|---|---|---|---|---|
| DE | 410244 | | * | 1/1991 |
| EP | 2083948 | A | * | 3/1982 |
| EP | 0111706 | | * | 6/1984 |
| EP | 0265638 | | * | 5/1988 |
| EP | 327 412 | | * | 8/1989 |
| EP | 0185787 | | * | 1/1992 |
| EP | 0491408 | | * | 6/1992 |
| GB | 2167901 | A | * | 4/1986 |
| GB | 8901236 | | * | 5/1992 |
| JP | 60-58635 | | * | 4/1985 |
| JP | 61-26240 | | * | 2/1986 |
| JP | 61-232646 | | * | 10/1986 |
| JP | 62-106645 | | * | 4/1987 |
| JP | 63-293946 | | * | 11/1988 |
| JP | 4092453 | | * | 3/1992 |

OTHER PUBLICATIONS

IBM Technical Disclosure Bulletin, vol. 30, No. 8, p. 252, Jan. 1988.*

IBM Technical Disclosure Bulletin, vol. 29, No. 3, p. 1328, Aug. 1986. □□.*

"A New Technology for Oxide Contact and Via Etch", by Pete Singer, □□Semiconductor International, p. 36 (1993). □□.*

Handbook on Semiconductors, (ed. C. Holson), vol. 4, p. 208 (1981).*

"Etching Applications and Trends of Dry Etching", Ephrath et al., □□Semiconductor Technology and Computer Systems, Ch. 2, p. 26. 1991. □□.*

(Continued)

*Primary Examiner*—Kevin M. Picardat
(74) *Attorney, Agent, or Firm*—Lisa K. Jorgenson; Bryan A. Santarelli

(57) ABSTRACT

A method for planarizing integrated circuit topographies, wherein, after a first layer of spin-on glass is deposited, a layer of low-temperature oxide is deposited before a second layer of spin-on glass.

29 Claims, 4 Drawing Sheets

SOG/LTO etchback

U.S. PATENT DOCUMENTS

| | | | | | |
|---|---|---|---|---|---|
| 4,676,867 | A | * | 6/1987 | Elkins et al. | 438/699 |
| 4,707,218 | A | * | 11/1987 | Giammarco et al. | 438/421 |
| 4,721,548 | A | * | 1/1988 | Morimoto | 438/697 |
| 4,755,476 | A | * | 7/1988 | Bohm et al. | 438/363 |
| 4,792,534 | A | * | 12/1988 | Tsuji et al. | 438/309 |
| 4,801,350 | A | * | 1/1989 | Mattox et al. | 438/702 |
| 4,801,560 | A | * | 1/1989 | Wood et al. | 438/624 |
| 4,824,767 | A | * | 4/1989 | Chambers et al. | 430/313 |
| 4,894,351 | A | * | 1/1990 | Batty | 438/624 |
| 4,912,061 | A | * | 3/1990 | Nasr | 438/231 |
| 4,962,414 | A | * | 10/1990 | Liou et al. | 257/740 |
| 4,986,878 | A | * | 1/1991 | Malazgirt et al. | 438/699 |
| 5,003,062 | A | * | 3/1991 | Yen | 438/761 |
| 5,063,176 | A | * | 11/1991 | Lee et al. | 438/297 |
| 5,068,711 | A | * | 11/1991 | Mise | 257/752 |
| 5,110,763 | A | * | 5/1992 | Matsumoto | 438/624 |
| 5,117,273 | A | * | 5/1992 | Stark et al. | 257/773 |
| 5,158,910 | A | * | 10/1992 | Cooper et al. | 438/631 |
| 5,166,088 | A | * | 11/1992 | Ueda et al. | 438/384 |
| 5,244,841 | A | * | 9/1993 | Marks et al. | 438/699 |
| 5,250,472 | A | * | 10/1993 | Chen et al. | 438/699 |
| 5,266,525 | A | * | 11/1993 | Morozumi | 438/624 |
| 5,310,720 | A | * | 5/1994 | Shin et al. | 438/760 |
| 5,320,983 | A | * | 6/1994 | Ouellet | 438/782 |
| 5,331,117 | A | * | 7/1994 | Bryant et al. | 257/510 |
| 5,399,533 | A | * | 3/1995 | Pramanik et al. | 438/624 |
| 5,435,888 | A | * | 7/1995 | Kalnitsky et al. | 438/624 |
| 5,534,731 | A | * | 7/1996 | Cheung | 257/759 |

OTHER PUBLICATIONS

VLSI Electronics Microstructures Science, vol. 8, ed. Norman Einspruch, p. □□298 (1984).*

"Plasma Etch Anisotrophy", C.B. Zarowin, J. Electrochem. Soc., Solid–State □□Science and Technology, p. 1144 (1983).*

"A Super Self–Aligned Source/Drain MOSFET," Lau et al., IEDM, p. 358 □□(1987). □□.*

"A Margin–Free Contact Process Using an AI303 Etch–Stop Layer for High □□Density Devices", Fukase et al., IEDM, p. 837 (1992).*

Research Disclosure No. 282, Oct. 1987, Havant GB p. 608, "Spin on Glass □□Insulator Enhancement".*

"Etching–Applications and Trends of Dry Etching", by L.M. Eprath and G.S. □□ Mathad, Handbook of Advanced Technology and Computer Systems at 27 ff (1988).*

"Reactive Ion Etching", by B. Gorowitz and R. Saia, 8 VLSI Electronics, □□297ff (1984).*

Patent Abstracts of Japan, vol. 15, No. 348 (E–1107) Sep. 4, 1991 & JP–A–31 33 131 (Mitsubishi Electric Corp.) Jun. 6, 1991.*

"Three 'Low Dt' Options for Planarizing the Premetal Dielectric on an Advanced Double Poly BiCMOS Process", by W. Dauksher, M. Miller, and C. Tracey, J. Electrochem. Soc., vol. 139, No. 2, p. 532 (1992).*

"The Effect of Plasma Cure Temperature on Spin–On Glass", by H. Namatsu and K. Minegishi, J. Electrochem. Soc., vol. 140, No., p. 140 (1991).*

"Hot–Carrier Aging of the MOS Transistor in the Presence of Spin–On Glass as the Interlevel Dielectric", by N. Lifschitz and G. Smolinsky, IEEE Electron Device Letters, vol. 12, No. 3, p. 140 (1991).*

"Advantages of Using Spin on Glass Layer in Interconnection Dielectric Planarization", Microelectronic Engineering, vol. 5 (1986).*

"Doped Silicon Oxide Deposition by Atmospheric Pressure and Low Temperature Chemical Vapor Deposition Using Tetraethoxysilane and Ozone", Fujino et al., J. Electrochem. Society, vol. 138, No. 10, p. 3019 Oct. 1991.*

"Polysilicon Planarization Using Spin–On Glass", S. Ramaswami and A. Nagy, J. Electrochem. Soc., vol. 139, No. 2, p. 591 (1992).*

* cited by examiner

Spin/Cure of SOG-1

Spin SOG-2 on top of SOG-1 and cure

SOG etchback

SOG-1 Spin/Cure

LTO deposition and SOG-2 spin cure

SOG/LTO etchback

SOG-1 Spin/Cure

LTO deposition and
SOG-2 spin/cure

SOG/LTO etchback

ENHANCED PLANARIZATION TECHNIQUE FOR AN INTEGRATED CIRCUIT

Matter enclosed in heavy brackets [ ] appears in the original patent but forms no part of this reissue specification; matter printed in italics indicates the additions made by reissue.

This application is a continuation of patent application Ser. No. 08/456,343, filed Jun. 1, 1995 now abandoned which is a continuation of Ser. No. 08/163,043 filed on Dec. 6, 1993 now U.S. Pat. No. 5,435,888.

BACKGROUND AND SUMMARY OF THE INVENTION

The present invention relates to formation and structures for interlevel dielectrics in integrated circuit fabrication.

A high degree of planarization is essential in the fabrication of integrated circuits with multiple levels of interconnect. Application of spin-on glass,[1] followed by global etch-back, is widely used in the industry to achieve the desired level of surface planarity. However, spin on glass ("SOG") and SOG etch-back technique are inadequate in a variety of situations where topologies with high aspect ratio and/or more topologies are encountered due to lack of planarization and/or sog cracks.

[1]Spin-on glass deposition is an example of a "sol-gel" process, which has been used in the semiconductor industry for many years. The unprocessed spin-on-glass material (available in numerous formulations) is a fluid material (actually a gel). After the liquid material is coated onto the face of a wafer, the wafer is rotated at high speed to throw off the excess material. The surface tension and adhesion of the material provides a flat (planarized) surface with a controlled thickness. The liquid material is then baked, to drive off solvents and provide a stable solid silicate glass. See generally, e.g., Dauksher et al., "Three 'low Dt' options for planarizing the pre-metal dielectric on an advanced double poly BiCMOS process," 139 J. Electrochem Soc 532–6 (1992), which is hereby incorporated by reference.

In most cases, successful planarization of severe topologies is achieved by a single or double SOG deposition+ etchback step in the following sequence:

a) a layer of dielectric is applied between the underlying surface and SOG.
b) application of a layer of SOG and SOG cure;
c) application of a second layer of SOG and SOG cure (optional); and
d) SOG etchback.

However, in extreme topologies, when the volume of SOG is very large, shrinkage of SOG during planarization and post-planarization processing leads to formation of undesirable cracks or voids.

The proposed method seeks to alleviate the problem of SOG cracking by performing the following operations:

a) Conventional dielectric deposition is applied (optional);
b) Application of a layer of SOG and SOG cure (as in prior art);
c) deposition of a layer of dielectric (e.g. TEOS/ozone deposition, or simple plasma-enhanced-TEOS,[2] or plasma-enhanced-silane oxide) with or without dopant can be used to adjust for etch back selectivity between SOG and dielectric. Thicknesses between 1000 Å to 5000 Å can be used.

[2]"TEOS," or tetraethoxysilane, is a popular and convenient feedstock for deposition of oxides from the vapor phase.

d) application of a second layer of SOG and/or SOG cure: and
e) SOG etchback.

This process will leave a layer of dielectric between the 1st and the 2nd SOG layers in locations where conventional planarization technique are likely to crack or void. This provides enhanced reliability.

The thickness of the first SOG layer can be reduced to avoid any undesired effects, such as field inversion of underlying devices or enhanced hot-carrier injection.[3]

[3]See, e.g., Lifshitz et al., "Hot-carrier aging of the MOS transistor in the presence of spin-on glass as the interlevel dielectric," 12 IEEE ELECTRON DEVICE LETTERS 140–2 (March 1991), which is hereby incorporated by reference.

A positive sloped valley is produced for second dielectric deposition. The step coverage will be enhanced due to this positive slope.

The structure provided by these steps has improved resistance to cracking, and improved resistance to other undesirable possible effects of thick spin-on glass layers.

According to a disclosed class of innovative embodiments, there is provided: An integrated circuit fabrication method, comprising the steps of: providing a partially fabricated integrated circuit structure; applying and curing spin-on glass, to form a first dielectric; depositing dielectric material under vacuum conditions, to form a second dielectric layer over said first layer; applying and curing spin-on glass, to form a dielectric stack including a third dielectric layer over said first and second layers; performing a global etchback to substantially remove said dielectric stack from high points of said partially fabricated structure; deposition of an interlevel dielectric; etching holes in said interlevel dielectric in predetermined locations; and depositing and patterning a metallization layer to form a desired pattern of connections, including connections through said holes.

According to a disclosed class of innovative embodiments, there is provided: An integrated circuit fabrication method, comprising the steps of: providing a partially fabricated integrated circuit structure; applying and curing spin-on glass, to form a first dielectric; depositing silicon dioxide under vacuum conditions, to form a second dielectric layer over said first layer; applying and curing spin-on glass, to form a dielectric stack including a third dielectric layer over said first and second layers; performing a global etchback to substantially remove said dielectric stack from high points of said partially fabricated structure; deposition of an interlevel dielectric; etching holes in said interlevel dielectric in predetermined locations; and depositing and patterning a metallization layer to form a desired pattern of connections, including connections through said holes.

According to a disclosed class of innovative embodiments, there is provided: An integrated circuit fabrication method, comprising the steps of: providing a partially fabricated integrated circuit structure; applying and curing spin-on glass, to form a first dielectric layer; depositing dielectric material under vacuum conditions, to form a second dielectric layer over said first layer, said second dielectric layer having a thickness equal to or less than said first layer; applying and curing spin-on glass, to form a dielectric stack including a third dielectric layer over said first and second layers, said third dielectric layer having a thickness equal to or greater than said second layer; performing a global etchback to substantially remove said dielectric stack from high points of said partially fabricated structure; deposition of an interlevel dielectric; etching holes in said interlevel dielectric in predetermined locations; and depositing and patterning a metallization layer to form a desired pattern of connections, including connections through said holes.

According to a disclosed class of innovative embodiments, there is provided: An integrated circuit, comprising: an active device structure, including therein a substrate, active device structures, isolation structures, and one or more patterned thin film conductor layers including an uppermost conductor layer; and a planarization structure, overlying recessed portions of said active device structure, comprising a layer of sol-gel-deposited dielectric overlain by a layer of vacuum-deposited dielectric overlain by a further layer of sol-gel-deposited dielectric; an interlevel dielectric overlying said planarization structure and said active device structure, and having via holes therein which extend to selected locations of said uppermost conductor layer; and an additional thin-film patterned conductor layer which overlies said interlevel dielectric and extends through said via holes to said selectred locations of said uppermost conductor layer.

BRIEF DESCRIPTION OF THE DRAWING

The present invention will be described with reference to the accompanying drawings, which show important sample embodiments of the invention and which are incorporated in the specification hereof by reference, wherein.

DESCRIPTION OF THE PREFERRED EMBODIMENTS

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

The disclosed process steps can be applied, for example, after fabrication of the first metal layer. Thus, the starting structure would be patterned metallization lines running over an interlevel dielectric which includes contact holes, and also has topographical excursions due to the underlying polysilicon layer(s) and field oxide layer. The maximum topographical excursion will include contributions from all of these. (However, the disclosed innovations can also be applied after fabrication of the second metal layer, before deposition of a third metal layer.)

Figure 1A:
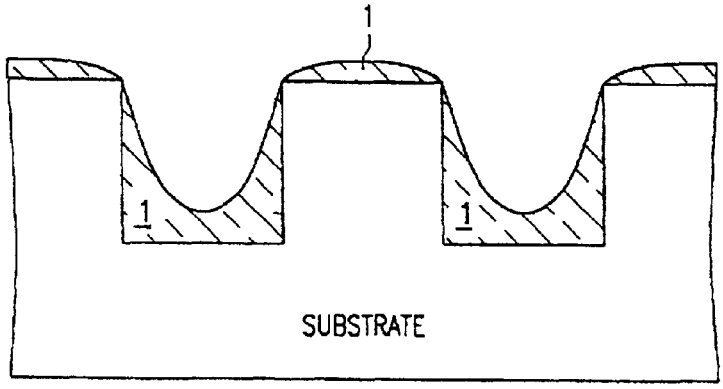
FIG. 1A (PRIOR ART)
FIGS. 1A–1C show steps in a conventional process.
Figure 1B:
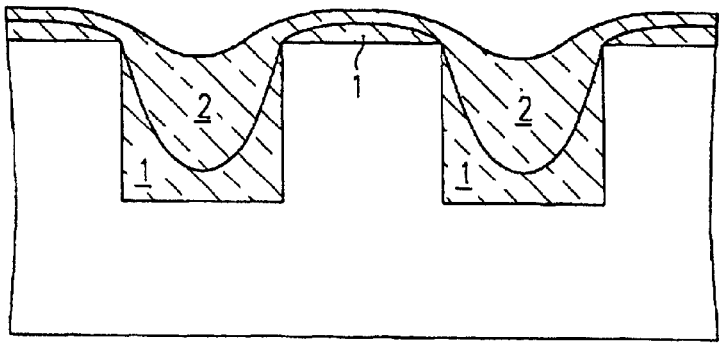
FIG. 1B (PRIOR ART)
Figure 1C:
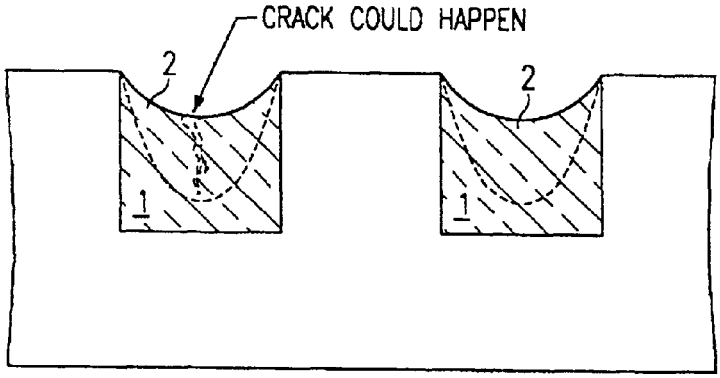
FIG. 1C (PRIOR ART)

FIGS. 1A–1C show steps in a conventional process. The starting structure will of course be defined by the previous process steps; but assume, for example, that the recesses have widths of 0.8 μm each, are spaced on a minimum pitch of 1.6 μm, and have a maximum depth of 1 μm. (Of course, these numbers are merely illustrative.)

As shown in FIG. 1A, a first layer 1 of SOG would be spun on and cured, to a thickness of e.g. 3000 Å in flat areas. (The thickness is substantially more in recessed areas ) As is well known to those of ordinary skill, the thickness of the SOG is determined by the individual composition and by the spin rate. As seen in FIG. 1A, a single deposition of SOG is not enough to fill the recesses.

As shown in FIG. 1B, a second layer 2 of SOG would then be spun on and cured, to provide an additional thickness of e.g. 3000 Å in flat areas.

A global etchback step is then performed, to remove the SOG from flat areas. The resulting surface contour, as shown in FIG. 1C, is susceptible to cracking.

Figure 2A:
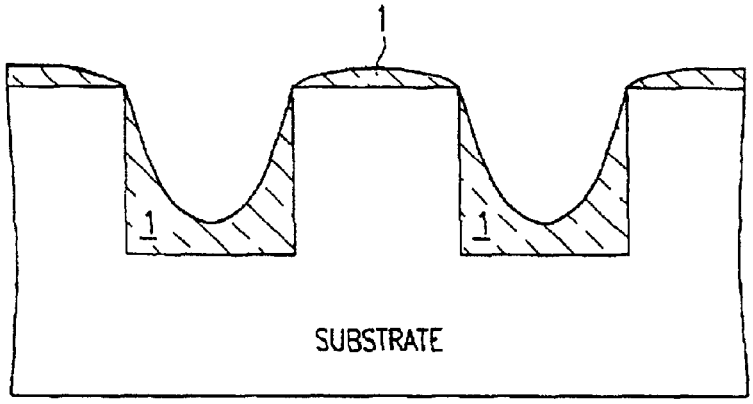
FIGS. 2A–2C show steps in a first embodiment of the invention.
Figure 2B:
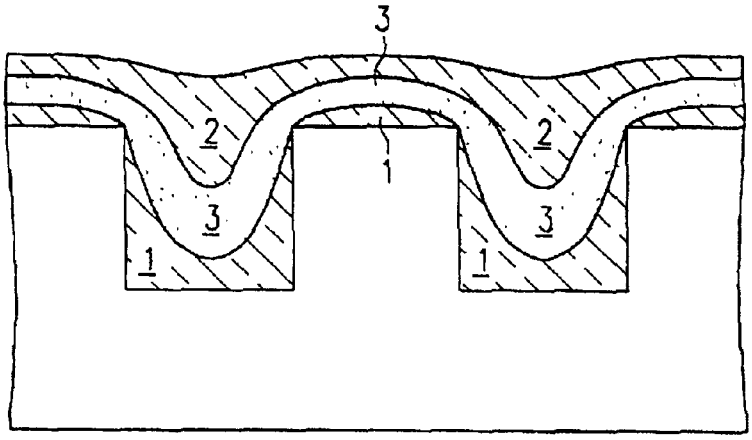
Figure 2C:
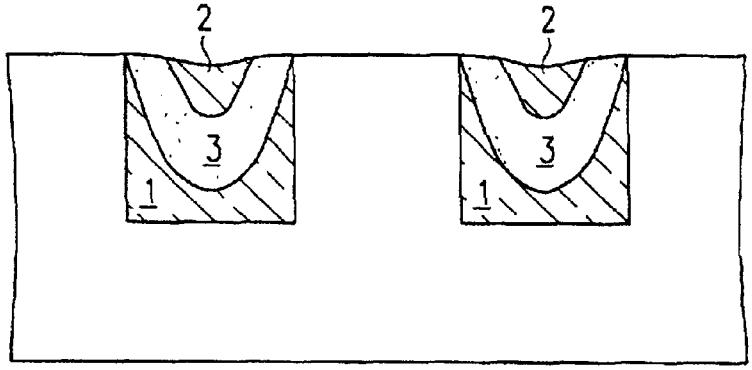

FIGS. 2A–2C show steps in a first embodiment of the invention. Assume that the same recess dimensions are used as in FIGS. 1A–1C. Again, the specific dimensions and parameters given here are merely illustrative, and do not delimit the invention.

A first layer 1 of SOG is deposited as in FIG. 1A. That is, for example, a siloxane-based spin-on glass[4] is spun on to a thickness of 2000 Å over flat areas, and is then cured for 60 minutes at 425° C.

[4]Such materials may be obtained, for example, from Ohka America™ or Allied Signal™ or other suppliers.

A layer 3 of low-temperature oxide is then deposited, to a thickness of 2000 Å. (For example, this may be done by plasma-enhanced deposition of TEOS.) This produces the structure shown in FIG. 2B.

A second layer 2 of SOG is then be spun on and cured, to provide an additional thickness of e.g. 3000 Å in flat areas.

A global etchback step is then performed, to remove the SOG and TEOS from flat areas. The resulting surface contour, as shown in FIG. 2C, provides improved filling of the recessed areas. Moreover, the combination of slightly different materials (SOG and low-temperature oxide) reduces susceptibility to cracking.

For simplicity, the drawing of FIG. 2C shows exactly 100% etchback, but of course the degree of etchback can be varied if desired.

Figure 3A:
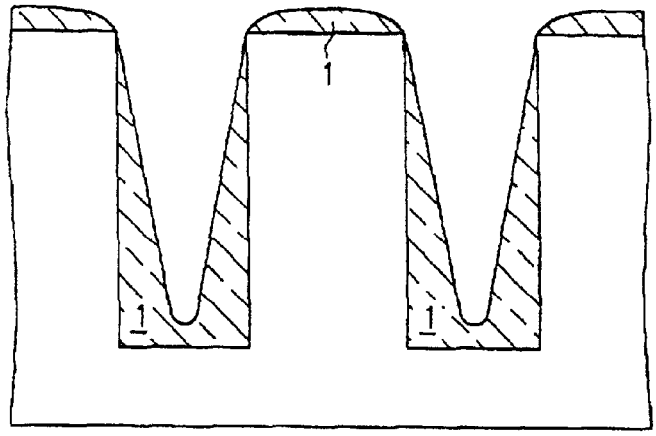
FIGS. 3A–3C show steps in a second embodiment of the invention.
Figure 3B:
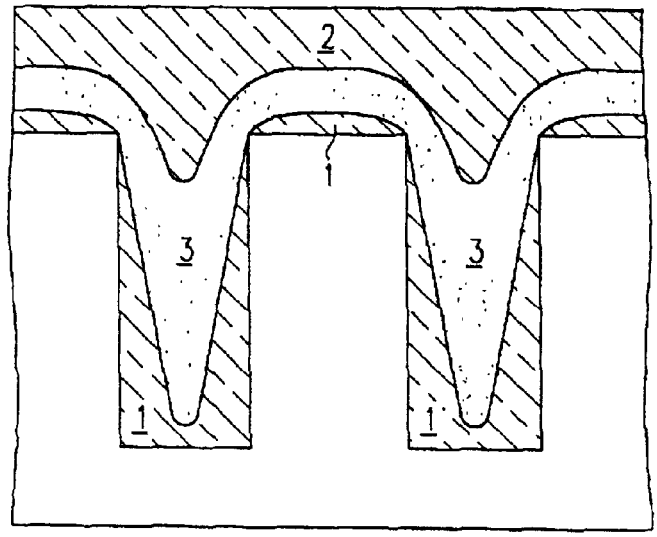
Figure 3C:
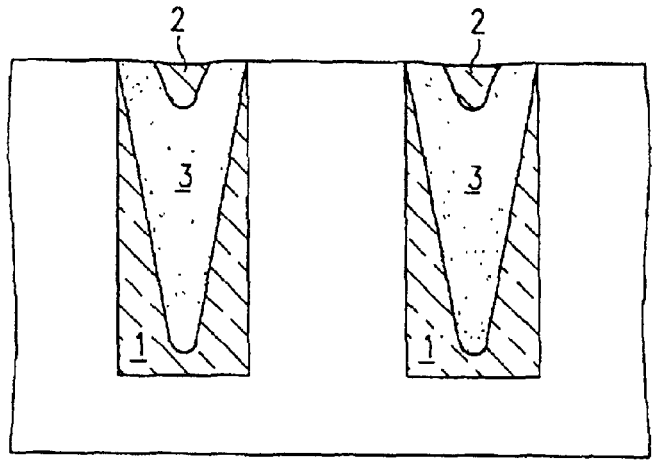

FIGS. 3A–3C show steps in a second embodiment of the invention. This may be particularly advantageous with more extreme topologies. In this embodiment, assume, for example, that the recessed areas have widths of 0.8 μm each, are spaced on a minimum pitch of 1.6 μm, and have a maximum depth of 2 μm. (Of course, these numbers are merely illustrative.)

A first layer 1 of SOG is spun on and cured to produce a thickness of 2000 Å over flat areas, as shown in FIG. 3A.

A layer 3 of low-temperature oxide is then deposited, to a thickness of 3000 Å. (For example, this may be done by plasma-enhanced deposition of TEOS.) This produces the structure shown in FIG. 3B.

A second layer 2 of SOG is then be spun on and cured, to provide an additional thickness of e.g. 2000 Å in flat areas.

A global etchback step is then performed, to remove the SOG and TEOS from flat areas. The resulting surface contour, as shown in FIG. 3C, provides improved filling of the recessed areas, even under extreme topologies. Moreover, the combination of slightly different materials (SOG and low-temperature oxide) reduces susceptibility to cracking.

For simplicity, the drawing of FIG. 3C shows exactly 100% etchback, but of course the degree of etchback can be varied if desired.

In alternative embodiments, it is also possible to deposit a plasma oxide before the first layer of spin-on glass. (This is commonly done to prevent direct contact between the SOG and the underlying metallization.) In this embodiment, 1000 Å–5000 Å of (for example) TEOS oxide would be deposited before the first layer of SOG.

Processing then continues with deposition of an interlevel dielectric, such as PSG, and conventional further processing steps.

One particular advantage of the disclosed invention is that it can be very easily implemented (in at least some processes) by a simple transposition of steps (depositing the low-temperature oxide before, rather than after, the second layer of spin-on glass).

Figure 4:
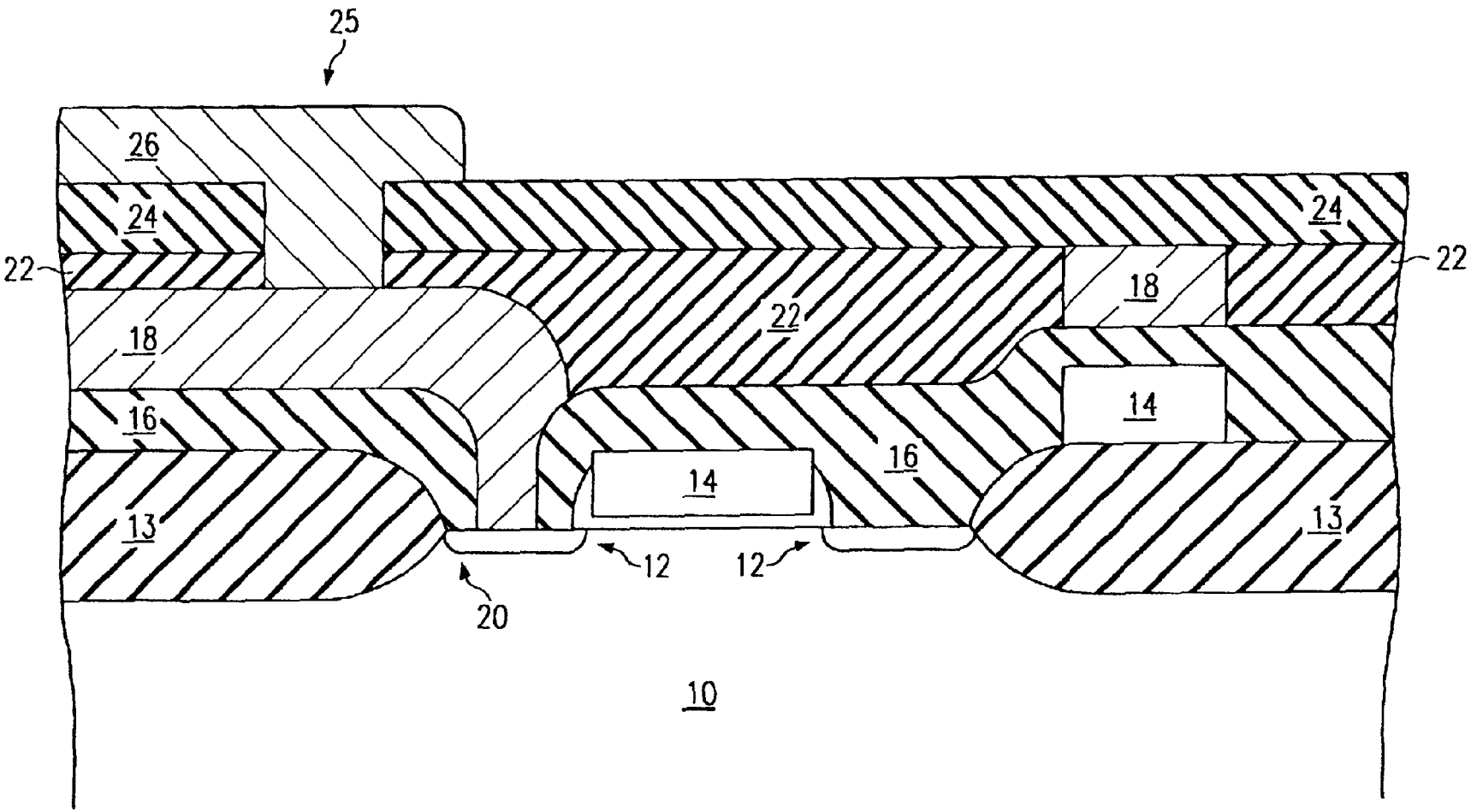
FIG. 4 shows a sample device structure incorporating a planarization layer according to the disclosed innovations.

FIG. 4 shows a sample device structure incorporating a planarization layer according to the disclosed innovations. In this example, the partially fabricated device structure included active devices 12 in a substrate 10, including polysilicon lines 14. Field oxide 13 provides lateral separation active devices. Metal lines 18 overlie a first interlevel dielectric 16 (e.g. of BPSG over TEOS), and make contact to active device areas at contact locations 20. (This provides the starting structure on which planarization is performed as described above.) A planarization layer 22 is then deposited, by the techniques described above, to reduce or eliminate the topographical excursions of the structure. An interlevel dielectric 24 overlies the planarization layer 22 (and the rest of the planarized structure), and includes via holes 25 through which a second metal layer 26 contacts the first metal layer 18. The structure shown can be topped by a protective overcoat (not shown) through which holes are etched to expose locations of contact pads in the second metal layer.

FURTHER MODIFICATIONS AND VARIATIONS

It will be recognized by those skilled in the art that the innovative concepts disclosed in the present application can be applied in a wide variety of contexts. Moreover, the preferred implementation can be modified in a tremendous variety of ways. Accordingly, it should be understood that the modifications and variations suggested below and above are merely illustrative. These examples may help to show some of the scope of the inventive concepts, but these examples do not nearly exhaust the full scope of variations in the disclosed novel concepts.

The disclosed innovative steps have been described in the context of via formation (e.g. forming connections from second metal to first metal, or third metal to second metal). Due to the accumulated topographical excursions, planarization is especially desirable at these stages. However, the disclosed innovative concepts can also be applied to planarization of lower levels as well.

The disclosed innovative concepts can also be applied to other spin-on materials, such as polyimide or polymethylmethacrylate.

As will be recognized by those skilled in the art, the innovative concepts described in the present application can be modified and varied over a tremendous range of applications, and accordingly the scope of patented subject matter is not limited by any of the specific exemplary teachings given.

What is claimed is:

1. An integrated circuit manufactured by the method comprising the acts of:

(a.) providing a partially fabricated integrated circuit structure;

(b.) applying and curing spin-on glass, to form a first dielectric layer;

(c.) depositing dielectric material, to form a second dielectric layer over said first dielectric layer;

(d.) applying and curing spin-on glass, to form a third dielectric layer, to produce a stack including said third dielectric layer over said first and second dielectric layers;

(e.) performing a global etchback to substantially remove portions of said dielectric stack from high points of said partially fabricated structure, wherein at least a portion of said third dielectric layer remains after said global etchback;

(f.) deposition of an interlevel dielectric at least over said remaining third dielectric layer;

(g.) etching holes in said interlevel dielectric in predetermined locations; and (h.) depositing and patterning a metallization layer to form a desired pattern of connections, including connections through said holes.

2. The integrated circuit of claim 1, wherein said deposition step (c.) is plasma-enhanced.

3. The integrated circuit of claim 1, wherein said deposition step (c.) uses TEOS as a source gas.

4. The integrated circuit of claim 1, comprising the additional step of applying a passivating dielectric, under vacuum conditions, after said step (a.) and Am before said deposition step (b.).

5. The integrated circuit of claim 1, Hi wherein said deposition step (b.) applies said spin-on glass with a thickness in the range of 1000–5000 Å inclusive.

6. The integrated circuit of claim 1, wherein said deposition step (d.) applies said spin-on glass with a thickness in the range of 1000–5000 Å inclusive.

7. The integrated circuit of claim 1, wherein said interlevel dielectric is a doped silicate glass.

8. An integrated circuit manufactured by the method comprising the acts of:

(a.) providing a partially fabricated integrated circuit structure;

(b.) applying and curing spin-on glass, to form a first dielectric layer;

(c.) depositing silicon dioxide, to form a second dielectric layer over said first dielectric layer;

(d.) applying and curing spin-on glass, to form a third dielectric layer to produce a dielectric stack including said third dielectric layer over said first and second layers;

(e.) performing a global etchback to substantially remove said dielectric stack from high points of said partially fabricated structure, wherein at least a portion of said spin-on glass of said third dielectric layer remains after said global etchback;

(f.) deposition of an interlevel dielectric at least over said remaining spin-on glass of said third dielectric layer;

(g.) etching holes in said interlevel dielectric in predetermined locations; and (h.) depositing and patterning a metallization layer to form a desired pattern of connections, including connections through said holes.

9. The integrated circuit of claim 8, wherein said deposition step (c.) is plasma-enhanced.

10. The integrated circuit of claim 8, wherein said deposition step (c.) uses TEOS as a source gas.

11. The integrated circuit of claim 8, comprising the additional step of applying a passivating dielectric, under vacuum conditions, after said step (a.) and before said deposition step (b.).

12. The integrated circuit of claim 8, wherein said deposition step (b.) applies said spin-on glass with a thickness in the range of 1000–5000 Å inclusive.

13. The integrated circuit of claim 8, wherein said deposition step (d.) applies said spin-on glass with a thickness in the range of 1000–5000 Å inclusive.

14. The integrated circuit of claim 8, wherein said interlevel dielectric is a doped silicate glass.

15. An integrated circuit manufactured by the method comprising the acts of:

(a.) providing a partially fabricated integrated circuit structure;

(b.) applying and curing spin-on glass, to form a first dielectric layer;

(c.) depositing dielectric material, to form a second dielectric layer over said first dielectric layer, said second dielectric layer having a thickness equal to or less than said first dielectric layer;

(d.) applying and curing spin-on glass, to form a third dielectric layer to produce a dielectric stack including said third dielectric layer over said first and second dielectric layers, said third dielectric layer having a thickness equal to or greater than said second layer;

(e.) performing a global etchback to substantially remove said dielectric stack from high points of said partially fabricated structure, wherein at least a portion of said third dielectric layer remains after said global etchback;

(f.) deposition of an interlevel dielectric at least over said remaining second dielectric layer;

(g.) etching holes in said interlevel dielectric in predetermined locations; and (h.) depositing and patterning a metallization layer to form a desired pattern of connections, including connections through said holes.

16. The integrated circuit of claim 15, wherein said deposition step (c.) is plasma-enhanced.

17. The integrated circuit of claim 15, wherein said deposition step (c.) uses TEOS as a source gas.

18. The integrated circuit of claim 15, comprising the additional step of applying a passivating dielectric, under vacuum conditions, after said step (a.) and before said deposition step (b.).

19. The integrated circuit of claim 15, wherein said deposition step (b.) applies said spin-on glass with a thickness in the range of 1000–5000 Å inclusive.

20. The integrated circuit of claim 15, wherein said interlevel dielectric is a doped silicate glass.

21. The integrated circuit of claim 15, wherein said deposition step (d.) applies said spin-on glass with a thickness in the range of 1000–5000 Å inclusive.

22. An integrated circuit, comprising:

(a.) an active device structure, including therein a substrate, active device structures, isolation structures, and one or more patterned thin film conductor layers including an uppermost conductor layer; and (b.) a planarization structure, overlying recessed portions of said active device structure, comprising a layer of sol-gel-deposited dielectric overlain by a layer of vacuum-deposited dielectric overlain by a further layer of sol-gel-deposited dielectric;

(c.) an interlevel dielectric overlying said planarization structure and said active device structure, and having via holes therein which extend to selected locations of said uppermost conductor layer; and (d.) an additional thin-film patterned conductor layer which overlies said interlevel dielectric and extends through said via holes to said selected locations of said uppermost conductor layer.

*23. A semiconductor structure, comprising:*

*a substrate;*

*a first layer of inorganic spin-on glass disposed on the substrate;*

*a first dielectric disposed on the first layer; and*

*a planarized second layer of inorganic spin-on glass disposed on the first dielectric.*

*24. The semiconductor structure of claim 23, further comprising:*

*a second dielectric disposed on the substrate; and*

*wherein the first layer of spin-on glass is disposed on the second dielectric.*

*25. The semiconductor structure of claim 23, further comprising:*

*a metal layer disposed on the substrate; and*

*wherein the first layer of spin-on glass is disposed on the metal layer.*

*26. The semiconductor structure of claim 23, further comprising:*

*a metal layer disposed on the substrate;*

*a second dielectric disposed on the metal layer; and*

*wherein the first layer of spin-on glass is disposed on the second dielectric.*

*27. The semiconductor structure of claim 23 wherein the first dielectric comprises a low-temperature oxide.*

*28. The semiconductor structure of claim 23, further comprising a planarized boundary that includes the planarized second layer of spin-on glass and a planarized portion of the first dielectric.*

*29. The semiconductor structure of claim 23, further comprising a planarized boundary that includes the planarized second layer of spin-on glass, a planarized portion of the first dielectric, and a planarized portion of the first layer of spin-on glass.*

* * * * *